United States Patent
Sakurai et al.

(10) Patent No.: US 7,229,293 B2
(45) Date of Patent: Jun. 12, 2007

(54) CONNECTING STRUCTURE OF CIRCUIT BOARD AND METHOD FOR MANUFACTURING THE SAME

(75) Inventors: Daisuke Sakurai, Osaka (JP); Kazuhiro Nishikawa, Osaka (JP); Norihito Tsukahara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/175,448

(22) Filed: Jul. 7, 2005

(65) Prior Publication Data
US 2006/0014403 A1    Jan. 19, 2006

(30) Foreign Application Priority Data
Jul. 15, 2004  (JP)  ............... 2004-208163

(51) Int. Cl.
*H01R 12/00*  (2006.01)
(52) U.S. Cl. .................................................. 439/74
(58) Field of Classification Search ................ 439/74; 174/252, 256, 260, 262; 29/830; 702/117; 438/114; 257/78, 686; 428/208
See application file for complete search history.

(56) References Cited

U.S. PATENT DOCUMENTS

| | | | | |
|---|---|---|---|---|
| 4,818,728 A * | 4/1989 | Rai et al. | .................... | 438/108 |
| 5,046,238 A * | 9/1991 | Daigle et al. | .................. | 29/830 |
| 5,274,912 A * | 1/1994 | Olenick et al. | ................ | 29/830 |
| 6,812,412 B2 * | 11/2004 | Obata et al. | ................. | 174/261 |
| 6,824,857 B2 * | 11/2004 | Lochun et al. | .............. | 428/209 |
| 6,971,167 B2 * | 12/2005 | Nishikawa et al. | ........... | 29/852 |

FOREIGN PATENT DOCUMENTS

JP   7-074446   3/1995

\* cited by examiner

*Primary Examiner*—Alexander Gilman
(74) *Attorney, Agent, or Firm*—Wenderoth, Lind & Ponack, L.L.P.

(57) ABSTRACT

First circuit board 10 including first resin base material 12 which is softened by heating and has a fusing property, and a plurality of first conductor patterns 14 formed on a surface of first resin base material 12, and second circuit board 20 on which a plurality of second conductor patterns 24 are formed with the same pitch as that of first conductor patterns 14 are provided. In the configuration, first conductor patterns 14 and second conductor patterns 24 are brought into mechanical contact with each other to provide electrical conduction; first resin base material 12 covers first conductor patterns 14 and second conductor patterns 24 and is bonded to second resin base material 22 of second circuit board 20, thereby connecting first circuit board 10 and second circuit board 20 to each other.

10 Claims, 7 Drawing Sheets

CONNECTING STRUCTURE OF CIRCUIT BOARD AND METHOD FOR MANUFACTURING THE SAME

BACKGROUND OF THE INVENTION

1. Field of the Invention

The present invention relates to a connecting structure for connecting between circuit boards. More specifically, the present invention relates to a connecting structure for connecting conductor patterns to each other by bringing them into contact with each other and a method for manufacturing the connecting structure.

2. Background Art

FIGS. 8A to 8C are sectional views showing a connection portion for illustrating main steps of a method for connecting conductor patterns to each other in a conventional circuit board. In FIG. 8A, first circuit board 500 includes first resin base material 502 and convex first conductor patterns 504 formed on the surface of first resin base material 502. Furthermore, second circuit board 506 includes second resin base material 508 and convex second conductor patterns 510 formed on the surface of second resin base material 508. First conductor patterns 504 of first circuit board 500 and second conductor patterns 510 of second circuit board 506 are provided at the same pattern pitch. Note here that on first circuit board 500 and second circuit board 506, in addition to conductor patterns 504 and second conductor patterns 510, further circuit patterns of various shapes are formed, and a functional component such as a semiconductor element and a passive component such as a resistor are mounted although they are not shown.

First conductor pattern 504 and second conductor pattern 510 are electrically and mechanically connected to each other as follows. That is to say, adhesive resin 512 is applied on the surface of second circuit board 506 on which second conductor patterns 510 are formed. As adhesive resin 512, thermosetting resin such as epoxy resin or epoxy-based resin is often used. After adhesive resin 512 is applied, second conductor patterns 510 of second circuit board 506 and first conductor patterns 504 of first circuit board 500 are allowed to face each other and the positions thereof are adjusted.

As shown in FIG. 8B, upper heating pressing plate 514 and lower heating pressing plate 516 press first circuit board 500 and second circuit board 506 in the direction shown by arrow 521, respectively.

As shown in FIG. 8C, in accordance with this pressing, adhesive resin 512 on second conductor pattern 510 is pushed to the side as space between first conductor pattern 504 and second conductor pattern 510 is reduced. When the space is further reduced, almost all the adhesive resin is removed from the space, so that first conductor pattern 504 and second conductor pattern 510 are brought into direct contact with each other. Thus, electrical conduction therebetween is secured. In this state, heating is continued while pressing. When epoxy resin, epoxy-based resin, or the like, is used as adhesive resin 512, adhesive resin 512 is heated at a temperature between 150° C. to 200° C. for 30 seconds to 60 seconds so as to be hardened by heating, and is then cooled down. Thus, electrical and mechanical connection is completed.

In the above-mentioned connecting method, first conductor patterns 504 and second conductor patterns 510 are conducting to each other in a state in which they are just in contact with each other, and they are bonded to each other with adhesive resin 512. In this connecting method, however, when first circuit board 500 and second circuit board 506 are pressed, slipping occurs between first conductor patterns 504 and second conductor patterns 510, so that conductor patterns are often displaced. Furthermore, since it is difficult to securely remove adhesive resin 512 from an interface between first conductor pattern 504 and second conductor pattern 510, a contact area is substantially reduced. Therefore, it is difficult to reduce connection resistance of a contact portion.

In particular, when pattern pitches of first conductor patterns 504 and second conductor patterns 510 are small and the contact area is small, such a displacement or remaining adhesive resin 512 may easily cause defects including short circuit between neighboring conductor patterns and an increase in the connection resistance of the contact portion.

To address such problems, Japanese Patent Unexamined Publication No. 7-74446 discloses the following method. That is to say, it discloses a connecting structure in which an electrical connection portion of a flexible printed wiring board using a thermosetting film as a substrate is formed by soft metal electrode, and this electrode is electrically connected to an electrode portion of the other printed wiring board with adhesive directly and subjected to thermocompression with the use of liquid-type electrically insulating adhesive. In such a method, the soft metal electrode, when it is pressed, is collapsed and extended on the surface of the other electrode by compression bonding to enter fine recessed portions of the other electrode so as to increase the contact area, and therefore, connection resistance can be reduced.

In order to achieve the above-mentioned effect, soft electrode is required to be used as a conductive material. However, as a conductive material generally used as an electrode of flexible printed wiring board, materials such as conductive paste mainly including silver (Ag) or copper (Cu), copper foil or copper plating are often used. In the case of such a material, a large pressing power is required for collapsing and expanding the material. Furthermore, even when such a large pressure power is applied, when fine convex and concave portions exist in the electrode portion, it is difficult to completely remove all the liquid electrically insulating adhesive existing in the concave portion. Therefore, this electrically insulating adhesive may remain in a part of the electrode surface, making it difficult to satisfactorily reduce the connection resistance of the contact portion. As the connecting pitch becomes smaller and the contact area is accordingly reduced, the effect caused by the fact that this connection resistance cannot be reduced is remarkable.

The object of the present invention is to provide a connecting structure of a circuit board in which no adhesive resin is provided between conductor patterns of a connection portion and even when conductor patterns are arranged with a fine pitch, connection resistance is small and short circuiting between neighboring conductor patterns does not occur.

SUMMARY OF THE INVENTION

A connecting structure of a circuit board of the present invention includes a first circuit board including a first resin base material which is softened by heating and has a fusing property, and a plurality of first conductor patterns formed on a surface of the first resin base material; and a second circuit board on which a plurality of second conductor patterns are formed with a same pitch as that of the first conductor patterns; wherein the first conductor patterns and the second conductor patterns are brought into mechanical contact with each other to provide electrical conduction; the first resin base material covers the first conductor patterns and the second conductor patterns and is bonded to a second resin base material of the second circuit board, thereby connecting the first circuit board and the second circuit board to each other.

According to this configuration, in the contact portion between the first conductor pattern and the second conductor pattern, an insulating material such as an adhesive is not included, both conductors are brought into direct contact with each other over the entire surface of the contact portion. Therefore, the connection resistance of the contact portion can be reduced. Furthermore, since solder, conductive adhesive, or the like, is not used in connection, it is possible to prevent defects such as short circuiting caused by solder, conductive adhesive, or the like, flowing to neighboring conductor patterns at the time of connection. As a result, a connecting structure of a circuit board having a small connection resistance even when conductor patterns are arranged with a fine pitch can be manufactured in an improved yield.

Furthermore, in the connecting structure of the circuit board, a width of the first conductor pattern of the first circuit board may be larger than a width of the second conductor pattern of the second circuit board. This configuration makes it easy to adjust the positions of the first circuit conductor patterns and the second conductor patterns. Furthermore, by softening the first resin base material to flow so as to cover the first conductor pattern and the second conductor pattern and hardening thereof, the first conductor pattern and the second conductor pattern serve as a wedge. Therefore, adhesive strength between the first circuit board and the second circuit board can be increased.

Furthermore, in the connecting structure of the circuit board as mentioned above, the first resin base material may be made of a thermoplastic resin material or a thermosetting resin material. According to this configuration, the first circuit board and the second circuit board can be bonded to each other without applying adhesive as in a conventional method.

Furthermore, a method for manufacturing a connecting structure of a circuit board includes: forming a first circuit board by forming a plurality of first conductor patterns on a surface of a first resin base material which is softened by heating and has a fusing property with a same pitch as that of a plurality of second conductor patterns formed on a second circuit board; arranging the first conductor patterns of the first circuit board facing the second conductor patterns of the second circuit board and adjusting positions of the first conductor patterns and the second conductor patterns; pressing the first circuit board and the second circuit board, so that the first conductor patterns and the second conductor patterns are brought into mechanical contact with each other so as to provide electrical conduction; pressing and heating the first circuit board and the second circuit board, so that the first resin base material is softened to cover the first conductor patterns and the second conductor patterns, to flow to the second resin base material of the second circuit board, and to be bonded to the second resin base material; and cooling the first circuit board and second circuit board.

According to this method, since the first conductor patterns and the second conductor patterns can be brought into direct contact with each other in a state in which an insulating material such as an adhesive is not included in contact portions between the first conductor patterns and the second conductor patterns, the connection resistance of the contact portion can be reduced. Furthermore, since solder, conductive adhesive, or the like, is not used in connection, it is possible to prevent defects such as short circuiting caused by solder, conductive adhesive, or the like, flowing to neighboring conductor patterns at the time of connection. As a result, a connecting structure having a small connection resistance even when conductor patterns are arranged with a fine pitch can be manufactured in an improved yield, at low cost and with high productivity.

Furthermore, in the above-mentioned manufacturing method, the thermoplastic resin material may be used as the first resin base material. With such a manufacturing method using a thermoplastic resin material, the first conductor patterns and the second conductor patterns are brought into mechanical contact with each other in the first place, and then the first resin base material is heated and pressed so as to be softened to have large flowability, thereby allowing the first resin base material to cover the first conductor patterns and the second conductor patterns and to be bonded to the second resin base material. Thus, a connecting structure of a circuit board having a small electrical connection resistance of a connection portion when conductor patterns are arranged with a fine pitch can be manufactured by simple steps.

Furthermore, in the above-mentioned manufacturing method, a semi-hardened thermosetting resin material is used as the first resin base material; and the step of bonding the first resin base material to the second resin base material includes pressing while heating the thermosetting resin material to a softening temperature of the thermosetting resin material, so that the thermosetting resin material covers the first conductor patterns and the second conductor patterns and is bonded to the second resin base material of the second circuit board; and subsequently heating the thermosetting resin material to a higher temperature so as to harden the thermosetting resin material.

According to this method, even with the use of thermoplastic resin material, it is possible to manufacture a connecting structure of a circuit board having a small electrical connection resistance of a connection portion. When the connecting structure is manufactured by using a thermosetting resin material, the heat resistant property of the thus manufactured connecting structure can be increased.

Furthermore, the step of forming the first circuit board may include, after forming the first conductor patterns on the surface of the first resin base material, further heating the first resin base material and pressing the first conductor patterns, thereby embedding the first conductor patterns in the first resin base material, so that a surface of the first conductor patterns and a surface layer of the first resin base material are made to be on the same plane.

According to this method, the first conductor patterns of the first circuit board are provided on the same plane as the surface layer, and the surface can be favorably flattened. Therefore, displacement in the positions can be avoided when the positions of the first conductor patterns and the second conductor patterns are adjusted, and connecting structures can be manufactured with high productivity even when the first conductor patterns and second conductor patterns are arranged with fine pitch.

Furthermore, the step of forming the first circuit board may include after forming the first conductor pattern having a width that is at least larger than a width of the second conductor pattern on the first resin base material surface, further heating the first resin base material and pressing the first conductor patterns, thereby embedding the first conductor patterns into the first resin base material and providing a space portion having a thickness that is smaller than a thickness of the second conductor pattern on a surface of the first conductor pattern.

Alternatively, the step of forming the first circuit board may include forming a recess portion having a width that is at least larger than that of the second conductor pattern of the second circuit board, having a thickness that is larger than that of the first conductor pattern, and having a thickness that is smaller than the total thickness of the first conductor pattern and the second conductor pattern; and forming the first conductor pattern in the recess portion, and providing a space portion having a thickness that is smaller than a thickness of the second conductor pattern on the surface of the first conductor pattern.

According to these methods, since a space portion for accommodating a part of the second conductor pattern can be formed on the surface of the first conductor pattern of the first circuit board, when the second conductor pattern is fitted in this space portion, positions can be adjusted easily with high precision.

As mentioned above, in the connecting structure of the circuit board of the present invention, since an insulating material such as an adhesive is not included in a contact portion between the first conductor patterns and the second conductor patterns, the conductors can be brought into direct contact with each other over the entire surface of the contact portion. Therefore, the electrical connection resistance of the contact portion can be reduced. Furthermore, since solder, conductive adhesive, or the like, is not used in connection, it is possible to prevent defectives such as short circuit caused by solder, conductive adhesive, or the like, flowing to neighboring conductor patterns at the time of connection. As a result, a connecting structure having a small electric connection resistance even when conductor patterns are arranged with a fine pitch can be manufactured in an improved yield.

DETAILED DESCRIPTION OF THE INVENTION

Figure 1:
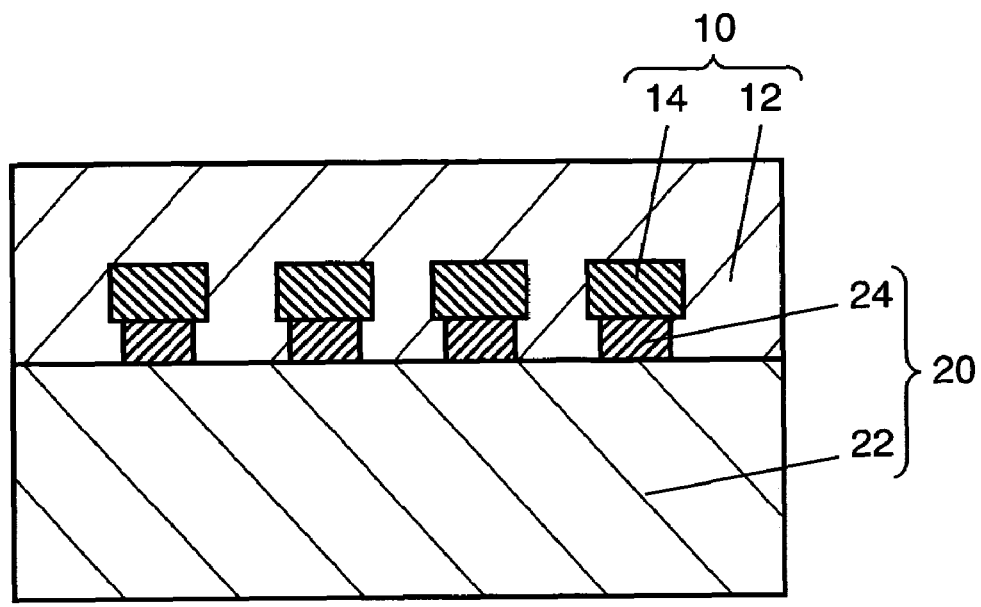
FIG. 1 is a sectional view of a main part of a connection portion showing a connecting structure of a circuit board according to a first embodiment of the present invention.

Hereinafter, embodiments of the present invention are described more particularly with reference to the drawings. Note here that the same reference numerals are given to the same elements and description therefor may be omitted.

First Embodiment

FIG. 1 is a sectional view of a main part of a connection portion showing a connecting structure of a circuit board according to a first embodiment of the present invention. In the configuration of the connecting structure of the circuit board of this embodiment, first circuit board 10 and second circuit board 20 are electrically connected to each other via first conductor patterns 14 and second conductor patterns 24, and first resin base material 12 of first circuit board 10 and second resin base material 22 of second circuit board 20 are bonded to each other. This bonding is carried out by thermal fusing of resin base material 12, when a material having a thermoplastic property and a thermal fusing property is used for first resin base material 12 of first circuit board 10.

Figure 2:
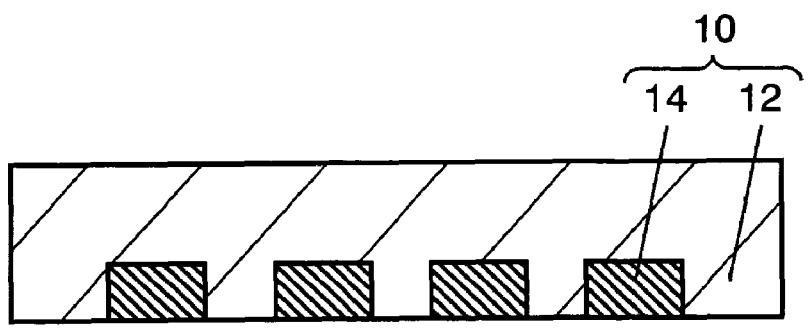
FIG. 2 is a sectional view of a connection portion of a first circuit board in the connecting structure of the circuit board according to the first embodiment.

FIG. 2 is a sectional view of a connection portion of first circuit board 10 shown in FIG. 1. In first circuit board 10, first conductor patterns 14, which are connection portions, are formed so that they are embedded in first resin base material 12. As first resin base material 12, thermosetting resin having a thermally fusing property is used. First conductor pattern 14 may be formed by attaching a copper foil on the surface of first resin base material 12 and etching thereof, or may be formed by printing conductive resin paste. Furthermore, it may be formed by a thin film process such as vapor deposition or plating.

A method for embedding first conductor pattern 14 formed by such a method into first resin base material 12 is as follows. That is to say, first resin base material 12 of a region on which first conductor pattern 14 is formed is heated and pressed from both side surfaces of first resin base material 12. Thus, first conductor pattern 14 can be embedded in first resin base material 12. Materials for first resin base material 12 are not particularly limited and any materials capable of exhibiting plasticity by heating and having a fusing property can be used. Examples of such materials include thermoplastic polyimide resin, polyethylene terephthalate glycol modified resin, liquid crystalline polymer, polyether ether ketone or polycarbonate resin, etc.

Note here that in first circuit board 10, a circuit pattern (not shown) connected to first conductor pattern 14 is formed. Furthermore, a functional component such as a semiconductor element and a passive component such as a resistor, a capacitor and so on may be mounted. When first conductor pattern 14 is formed on the surface of first circuit board 10, a sandblasting process, a corona discharge process, or the like, may be carried out in advance in order to improve the bonding property.

For second resin base material 22 of second circuit board 20, the same resin material as that of first circuit board 10 may be used. However, the material is not particularly limited to such resin materials and various base materials may be used. That is to say, resin materials used for second resin base material 22 of second circuit board 20 are not particularly limited and any materials to which favorable bonding is provided may be used. Such materials may include epoxide woven glass, epoxide cellulose paper, phenolic cellulose paper, polyethylene terephthalate resin, polyethylene naphthalate resin, polyimide resin, and the like.

Second conductor pattern 24 may be formed by attaching, for example, a copper foil on the surface of second resin base material 22 of second circuit board 20 and etching thereof, or may be formed by printing conductive resin paste, or may be formed by vapor deposition, plating, or the like. Also in this circuit board 20, a circuit pattern connected to second conductor pattern 24 is formed. Furthermore, on this circuit pattern, a functional component such as a semiconductor element or a passive component such as resistor may be mounted (although these are not shown). Furthermore, when second conductor patterns 24 are formed on the surface of second circuit board 20, a sandblasting process, a corona discharge process, or the like, may be carried out in advance in order to improve the bonding property.

Hereinafter, a method for manufacturing a connecting structure of a circuit board according to this embodiment is described with reference to FIGS. 3A to 3E. FIGS. 3A to 3E are sectional views showing main steps for manufacturing the connecting structure of the circuit board according to this embodiment.

Figure 3A:
FIGS. 3A to 3E are sectional views showing main steps for manufacturing the connecting structure of the circuit board according to the first embodiment.

FIG. 3A is a sectional view showing a state in which first conductor pattern 14 of first circuit board 10 and second conductor pattern 24 of second circuit board 20 are allowed to face each other and the positions thereof are adjusted. At this time, in this embodiment, the width of first conductor pattern 14 is made to be larger than that of second conductor pattern 24. In such a configuration, as shown in FIG. 3E, first conductor pattern 14 and second conductor pattern 24 serve as a wedge, so that adhesive strength of first resin base material 12 can be increased.

Figure 3B:
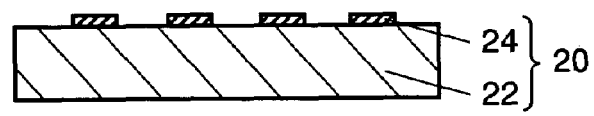
Figure 3B:
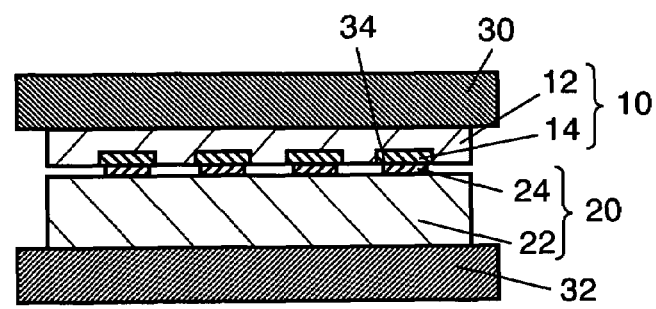

As shown in FIG. 3A, after the positions of first conductor patterns 14 and second conductor patterns 24 are adjusted, as shown in FIG. 3B, first circuit board 10 and second circuit board 20 are pressed by upper heating pressing plate 30 and lower heating pressing plate 32. FIG. 3B shows a state in which first conductor pattern 14 and second conductor pattern 24 are brought into direct contact with each other. In this state, first resin base material 12 is not yet brought into contact with second resin base material 22. Furthermore, in this embodiment, unlike a conventional connecting method, no adhesives are applied on the surface of second conductor pattern 24. Moreover, as shown in FIG. 3B, first conductor pattern 14 and second conductor pattern 24 are brought into direct contact with each other in the first place. Therefore, the conductors are brought into direct and favorable contact with each other, resulting in the contact resistance of contact portion 34 being radically reduced. Furthermore, unlike a conventional method, adhesive on the surface of second conductor pattern 24 is not required to be removed to the side, so that the pressure power is not required to be so large.

Note here that by subjecting the surfaces of first conductor patterns 14 and second conductor patterns 24 to a surface treatment such as gold plating, an electrical connection resistance value of contact portion 34 can be further reduced. Furthermore, ultrasonic vibration may be applied to contact portion 34 so as to carry out ultrasonic bonding of metals.

As mentioned above, after first conductor patterns 14 and second conductor patterns 24 are brought into electrical contact with each other, upper heating pressing plate 30 and lower heating pressing plate 32 are heated and pressed. First resin base material 12 of first circuit board 10 is softened due to heating by upper heating pressing plate 30. For example, when thermosetting polyimide alloy resin, which has a softening temperature of 130° C., is used as first resin base material 12, by heating it to the range from 150° C. to 200° C., the material is softened and thermally fused.

Figure 3C:
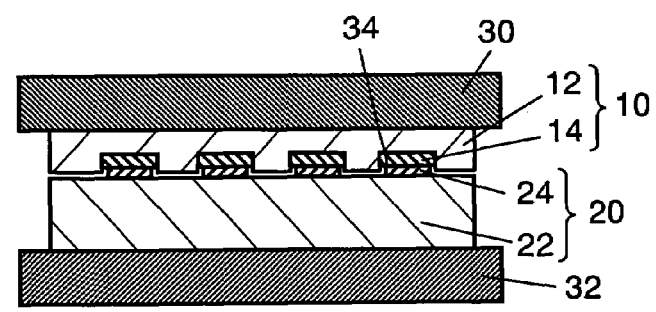

As shown in FIG. 3C, by continuing to heat and press, first resin base material 12 is softened, and first conductor pattern 14 and second conductor pattern 24 are pushed to be gradually embedded in first resin base material 12.

Figure 3D:
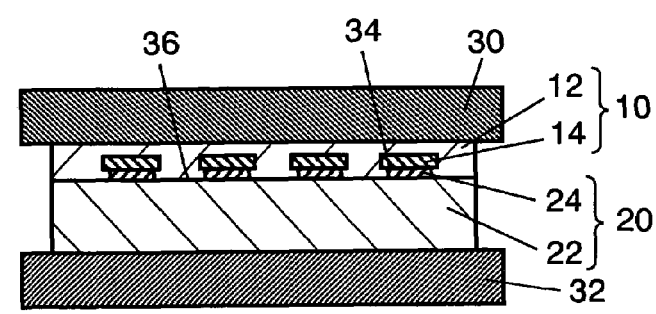
Figure 3E:
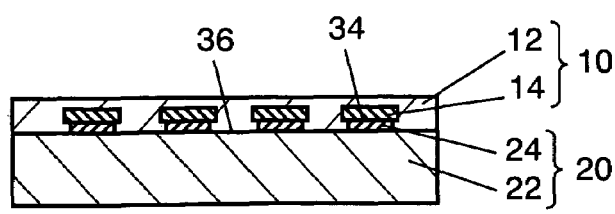

As shown in FIG. 3D, by further continuing to heat and press, first conductor pattern 14 and second conductor pattern 24 are completely embedded in first resin base material 12. At the same time, first resin base material 12 and second resin base material 22 are bonded to each other in bonding portion 36.

FIG. 3E is a sectional view showing a state in which bonding connection is completed and heating is stopped, followed by cooling first resin base material 12 to be hardened, and then upper heating pressing plate 30 and lower heating pressing plate 32 are removed. A sectional view shown in FIG. 3E shows the connecting structure of the circuit board of the embodiment shown in FIG. 1.

As mentioned above, the connecting structure of the circuit board of this embodiment can be formed. In the method for manufacturing the connecting structure of the circuit board of the present invention, since first conductor patterns 14 and second conductor patterns 24 are brought into direct contact with each other in the first place, the electric connection resistance of the contact portion 34 can be made extremely small.

Furthermore, since first conductor patterns 14 of first circuit board 10 are pressed and embedded in first resin base material 12, the surface is flat. Furthermore, no adhesive is applied on second conductor patterns 24 unlike a conventional structure. Accordingly, when first conductor patterns 14 and second conductor patterns 24 are pressed into contact with each other, displacement due to slipping does not occur. Therefore, even if the pitch of the conductor patterns is small, short circuiting between neighboring conductor patterns hardly occurs. Stable connection can be achieved even when conductor patterns are arranged with a fine pitch.

Furthermore, when either first circuit board 10 or second circuit board 20 is found to be defective after connection, first circuit board 10 and second circuit board 20 can be separated from each other by heating bonding portion 36 again and therefore repairing can be carried out. That is to say, when bonding portion 36 is again heated to a temperature above the softening temperature of first resin base material 12, since first conductor pattern 14 and second conductor pattern 24 are just in contact with each other, first circuit board 10 can be separated from second circuit board 20 easily. After separation, on the surface of the second conductor pattern 24 of second circuit board 20, foreign substances such as first resin base material 12 are not attached and the surface is kept clean.

A part of first resin base material 12 may remain between second conductor patterns 24 on the surface of second resin base material 22. However, if appropriate heating temperature and heating time are employed, the amount of the remaining materials can be extremely reduced. Therefore, by preparing new first circuit board 10, aligning first conductor patterns 12 of this new first circuit board 10 with respect to second conductor patterns 24 of second circuit board 20, and carrying out steps described in FIGS. 3A to 3E, repairing can be carried out easily.

Figure 4:
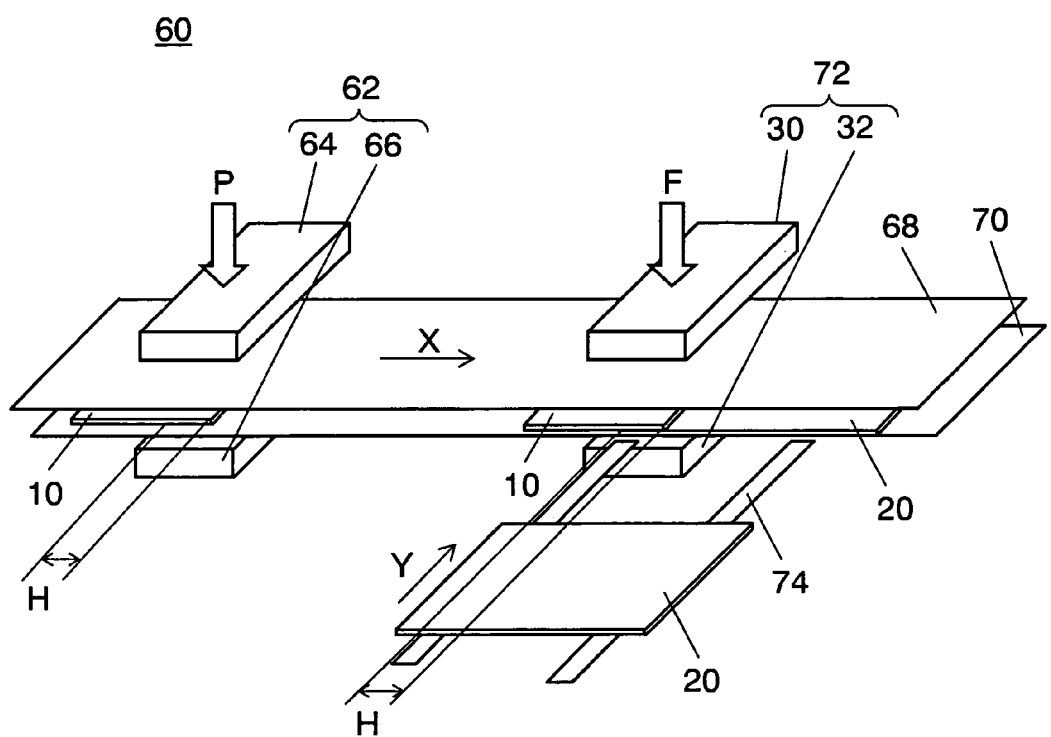
FIG. 4 is a schematic view showing an example of a circuit board connecting apparatus for manufacturing the connecting structure of the circuit board according to the first embodiment.
Figure 5:
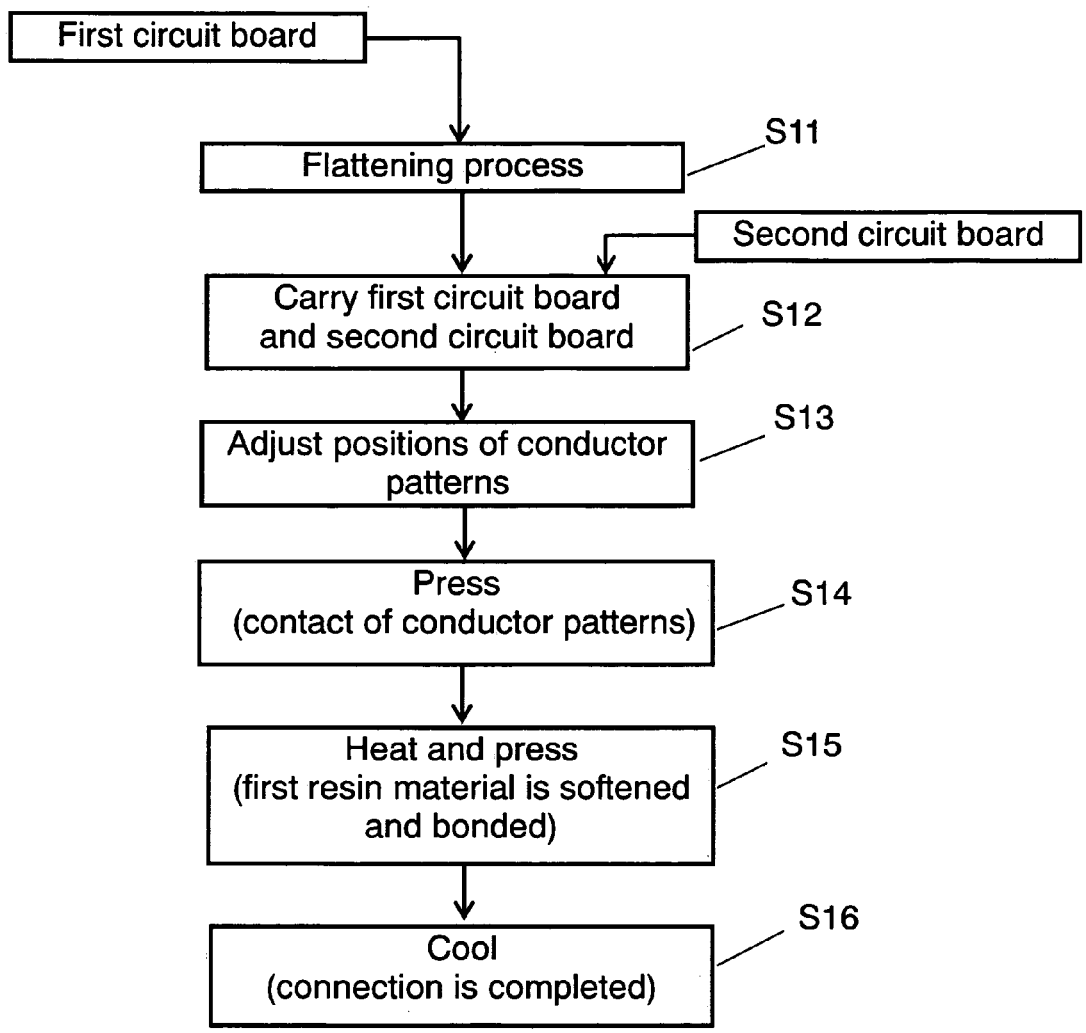
FIG. 5 is a flow chart showing an operation of the circuit board connecting apparatus for manufacturing the connecting structure of the circuit board according to the first embodiment.

FIG. 4 is a schematic view showing an example of the configuration of a circuit board connecting apparatus for manufacturing the connecting structure of the circuit board according to the embodiment. FIG. 5 is a flow chart showing an operation thereof.

Hereinafter, a configuration and operation of circuit board connecting apparatus 60 is described with reference to these drawings. Circuit board connecting apparatus 60 includes flattening unit 62, thermocompression unit 72 and two buffer films 68 and 70.

Flattening unit 62 is a mechanism for embedding first conductor patterns (not shown) of first circuit board 10 into a first resin base material (not shown) and flattening thereof. Thermocompression unit 72 is a mechanism for connecting first conductor patterns of first circuit board 10 and second conductor pattern (not shown) of second circuit board 20 by heating and pressing. In addition, buffer films 68 and 70 serve as a buffer so that first circuit board 10 and second circuit board 20 are not brought into direct contact with flattening unit 62 and thermocompression unit 72.

Note here that a carrier mechanism for carrying first circuit board 10 and second circuit board 20, a position adjusting portion for adjusting the positions of the first conductor patterns and the second conductor patterns, a power supply for heating flattening unit 62 and thermocompression unit 72, a mechanism for pressing, and a control unit for controlling thereof are provided but they are not shown.

As shown in FIG. 5, firstly, by using upper heating pressing plate 64 and lower heating pressing plate 66 of flattening unit 62, flattening process for embedding the first conductor patterns of first circuit board 10 into first resin base material is performed (step S11).

As shown in FIG. 4, a conductor pattern region "H" in which first conductor patterns of first circuit board 10 are formed is sandwiched by two buffer films 68 and 70. Thereafter, the conductor pattern region "H" is heated and pressed by pressing of upper heating pressing plate 64 and lower heating pressing plate 66 of flattening unit 62. Due to this heating, first resin base material of first circuit board 10 is softened and the first conductor patterns are embedded in the first resin base material and at the same time, the surface is flattened.

Next, first circuit board 10 on which first conductor patterns are flattened and second circuit board 20 are carried to the position of thermocompression unit 72, respectively (Step S12).

First circuit board 10 together with buffer films 68 and 70 are carried to thermocompression unit 72 by a carrier mechanism (not shown). Second circuit board 20 is carried to thermocompression unit 72 by substrate carrier mechanism 74. Note here that first circuit board 10 and second circuit board 20 are carried to thermocompression unit 72 so that first conductor patterns of first circuit board 10 and second conductor patterns of second circuit board 20 are facing each other.

In thermocompression unit 72, as shown in FIG. 4, second conductor patterns of conductor pattern region "H" of first circuit board 10 and second conductor patterns of second circuit board 20 are allowed to face each other and positions are adjusted (Step S13). The adjustment of positions is carried out as follows. For example, a camera is disposed between thermocompression unit 72 and first circuit board 10, the first conductor patterns and second conductor patterns are automatically recognized by using the camera, and positions are adjusted while shifting the first circuit board 10 or second circuit board 20 by a control portion.

When the adjustment of positions is completed, first circuit board 10 and second circuit board 20 are pressed by upper heating pressing plate 30 and lower heating pressing plate 32 of thermocompression unit 72. Thus, as shown in FIG. 3B, first conductor patterns and second conductor patterns are brought into direct contact with each other, so that they can be electrically connected to each other (step S14).

Furthermore, when heating while pressing is continued so as to soften the first resin base material, the first resin base material flows between the first conductor pattern and the second conductor pattern and is brought into contact with the second resin base material of second circuit board 20 and bonded thereto (step S15).

Thereafter, when thermocompression unit 72 is removed from first circuit board 10 and second circuit board 20 and cooled down, the first resin base material is hardened and bonding is completed (step S16). Note here that heating may be stopped and cooled down in a state in which pressing is carried out by thermocompression unit 72.

Hereinafter, specific examples for manufacturing a connecting structure of a circuit board by the above-mentioned method is described. In this specific example, thermoplastic polyimide was used for first resin base material 12 of first circuit board 10. The thickness was 0.1 mm. On the surface of this first resin base material 12, first conductor patterns 14 were formed by printing using a conductive resin paste. The line width of first conductor pattern 14 was 0.25 mm; line spacing was 0.25 mm; wiring pitch was 0.5 mm; and film thickness was 25 µm. The number of wirings of first conductor pattern 14 was 50. The flattening process was performed for the thus formed first conductor pattern 14. The flattening process was performed by setting first circuit board 10 to flattening unit 62 of circuit board connecting apparatus 60 under conditions where the pressure power was 100 MPa, the heating temperature during thermal pressing was 180° C. and the pressing time was 5 to 60 minutes. By this flattening process, as shown in FIG. 2, first circuit board 10 having a structure in which first conductor patterns 14 are embedded in first resin base material 12 was obtained.

In second circuit board 20, second resin base material 22 made of glass epoxy resin was used and second conductor patterns 24 were formed on the surface of resin base material 22 by plating. The line width of second conductor pattern 24 was 0.15 mm, line spacing was 0.28 mm, wiring pitch was 0.5 mm and film thickness was 25 µm.

Next, first circuit board 10 and second circuit board 20 were transferred to thermocompression unit 72 of circuit board connecting apparatus 60 and connected by heating and pressing. The positions of first conductor patterns 14 of first circuit board 10 and second conductor patterns 24 of second circuit board 20 were adjusted and connected to each other by heating and pressing in accordance with the steps shown in FIG. 3. The heating temperature at the time of connecting was 180° C., pressure power was 1 kgf/cm$^2$ to 10 kgf/cm$^2$, and heating and pressing time was 5 to 60 minutes.

First circuit board 10 and second circuit board 20 were connected in this way. As a result, the electric connection resistance of contact portion 34 was ½ or less and position displacement was ±30 µm or less as compared with a conventional method. Furthermore, it could be confirmed that satisfactory large bonding strength was obtained.

Note here that in this embodiment, the width of first conductor pattern 14 was made to be larger than that of second conductor pattern 24. However, the present invention is not limited to this configuration. For example, the width of first conductor pattern 14 may be made to be smaller than or to have the same width as the width of second conductor pattern 24. Furthermore, the thickness of first conductor pattern 14 and second conductor pattern 24 are not particularly limited, and they may be appropriately determined from necessary wiring resistance value, etc.

Second Embodiment

Figure 6A:
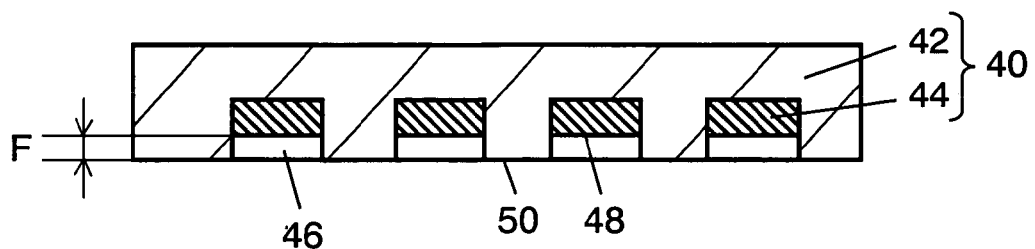
FIGS. 6A and 6B are sectional views showing main steps of a method for manufacturing a connecting structure of a circuit board according to a second embodiment of the present invention.
Figure 6B:
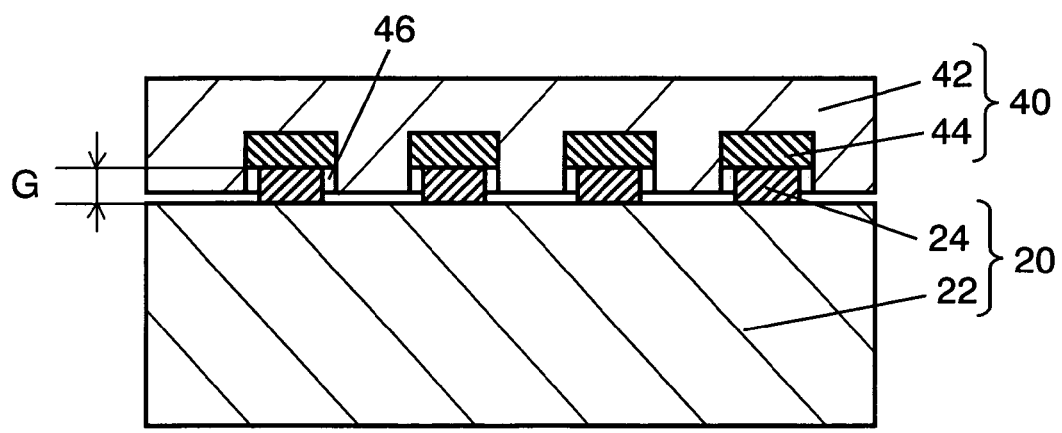

FIGS. 6A and 6B are sectional views showing main steps of a method for manufacturing a connecting structure of a circuit board according to a second embodiment of the present invention. FIG. 6A is a sectional view showing first circuit board 40. FIG. 6B is a sectional view showing a state in which first circuit board 40 and second circuit board 20 are pressed until first conductor patterns 44 and second conductor patterns 24 are brought into contact with each other. Note here that an upper heating pressing plate and a lower heating pressing plate for pressing are not shown.

The connecting structure of the circuit board of this embodiment is different from that of the first embodiment in the structures of first conductor patterns 44 of first circuit board 40. That is to say, in this embodiment, first conductor patterns 44 of first circuit board 40 are embedded in first resin base material 42, and surface 48 of first conductor pattern is disposed inwardly from the surface layer 50 of first resin base material 42. Therefore, space portion 46 corresponding to level difference "F" between surface 48 of first conductor pattern 44 and surface layer 50 of first resin base material 42 is provided. The level difference "F" of space portion 46 is set to be smaller than "G" that is a thickness of second conductor pattern 24 as shown in FIG. 6B.

In order to produce such a structure, for example, by using a die having the same shape as that of first conductor pattern 44 and having a height including the height of first conductor pattern 44 and level difference "F," first conductor patterns 44 may be embedded in first resin base material 42 by heating and pressing. Alternately, a recess portion having a depth including the height of first conductor pattern 44 and level difference "F" is provided in first resin base material 42 in advance by using a die having a height including the height of first conductor pattern 44 and level difference "F", and then first conductor pattern 44 may be formed in the recess portion.

Thus, when space portion 46 is provided on the surfaces of first conductor pattern 44 of first circuit board 40 as shown in FIG. 6, it becomes easy to adjust the positions of first conductor pattern 44 of first circuit board 40 and second conductor pattern 24 of second circuit board 20. That is to say, second conductor pattern 24 is fitted into space portion 46 of first circuit board 40 and at the same time, first conductor pattern 44 and second conductor pattern 24 are brought into direct contact with each other. Thus, a favorable electrical contact state is realized.

Thereafter, by carrying out steps as those shown in FIG. 3, first resin base material 42 of first circuit board 40 is softened by heating and pressing so as to cover the peripheries of first conductor patterns 44 and second conductor patterns 24 and to be bonded to second resin base material 22 of second circuit board 20, which is then cooled after bonding. Thereafter, when an upper heating pressing plate and a lower heating pressing plate (which are not shown) are removed, a connecting structure of a circuit board according to this embodiment can be obtained.

Hereinafter, an example of a specific configuration is described.

As first resin base material 42 of first circuit board 40, thermoplastic polyimide having a thickness of 0.1 mm was used. First of all, first resin base material 42 was provided with a recess portion having a depth including the height of first conductor pattern 44 and level difference "F" in advance by using a die having a height including the height of first conductor pattern 44 and level difference "F". Thereafter, first conductor pattern 44 was formed in this recess portion. At this time, first conductor pattern 44 was formed by using conductive resin paste by a drawing method. The line width of first conductor pattern 44 was 0.3 mm; line spacing was 0.25 mm; wiring pitch was 0.55 mm; and film thickness was 25 μm. The number of wirings of first conductor pattern 44 was 50.

In second circuit board 20, second resin base material 22 made of glass epoxy resin was used and second conductor patterns 24 were formed on the surface of resin base material 22 by plating. The line width of second conductor pattern 24 was 0.2 mm, line spacing was 0.35 mm, wiring pitch was 0.55 mm, and film thickness was 25 μm.

As mentioned above, since the thickness of second conductor pattern 24 was set to 25 μm, the level difference "F" was set to be smaller than this thickness, i.e., 15 μm. Therefore, the depth of the recess portion was set to 40 μm corresponding to the total of the thickness of first conductor pattern 44 (25 μm) and the level difference "F".

Next, first circuit board 40 and second circuit board 20 were connected to each other by heating by using circuit board connecting apparatus 60 described in the first embodiment. In this case, since the flattening process by flattening unit 62 was not required, first circuit board 40 and second circuit board 20 were transferred to thermocompression unit 72 where they were heated and pressed so as to be connected to each other. After second conductor pattern 24 of second circuit board 20 was fitted into space portion 46 on first conductor pattern 44 of first circuit board 40, they were heated and pressed in accordance with the steps that are the same as those in the first embodiment. The heating temperature at the time of connection was 180° C., pressure power was 1 kgf/cm$^2$ to 10 kgf/cm$^2$, and heating and pressing time was 5 to 60 minutes.

By carrying out the above-mentioned steps, a connecting structure of a circuit board was obtained, in which first conductor patterns 44 of first circuit board 40 and second conductor patterns 24 of second circuit board 20 were brought into direct contact with each other to provide favorable electrical conduction, and first resin base material 42 was softened to be bonded to second resin base material 22.

In the connecting structure of the circuit board of this embodiment, positions are adjusted easily and further short-circuiting between neighboring conductor patterns can be prevented reliably.

Third Embodiment

Figure 7A:
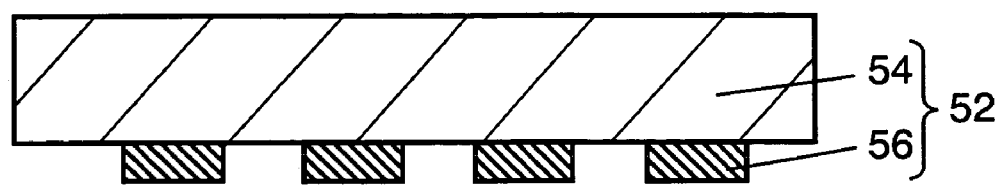
FIGS. 7A and 7B are sectional views showing main steps of a method for manufacturing a connecting structure of a circuit board according to a third embodiment of the present invention.
Figure 7B:
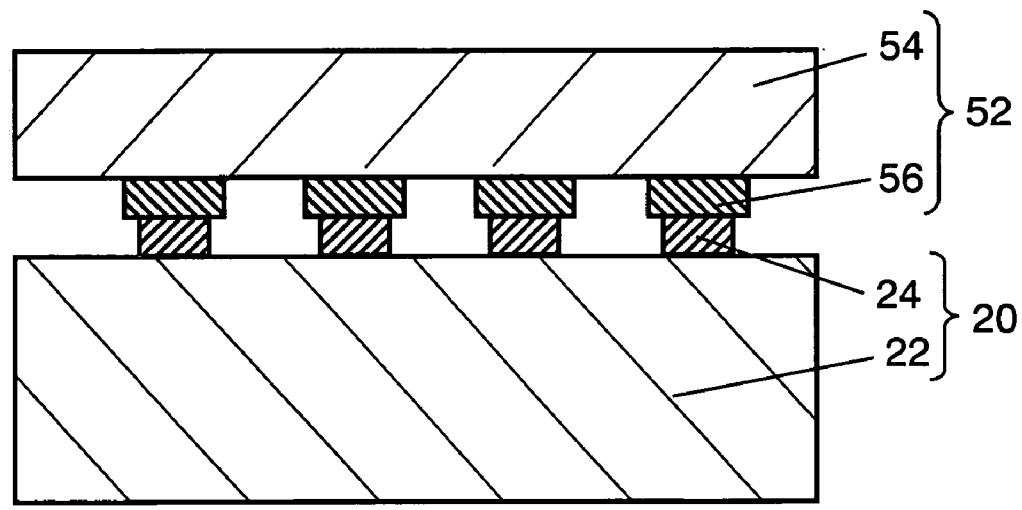

FIGS. 7A and 7B are sectional views showing main steps of a method for manufacturing a connecting structure of a circuit board according to a third embodiment of the present invention.

FIG. 7A is a sectional view showing first circuit board 52. FIG. 7B is a sectional view showing a state in which first circuit board 52 and second circuit board 20 are pressed until first conductor patterns 56 and second conductor patterns 24 are brought into contact with each other. Note here that an upper heating pressing plate and a lower heating pressing plate for pressing are not shown.

The connecting structure of the circuit board of this embodiment is different from that of the first embodiment in the structure of first conductor patterns 56 of first circuit board 52. In this embodiment, as shown in FIG. 7A, first conductor patterns 56 of first circuit board 52 are formed on the surface of first resin base material 54 and are not embedded in first resin base material 54. Therefore, first conductor pattern 56 can be easily formed on the surface of first resin base material 54, for example, by printing conductive resin paste.

Figure 8A:
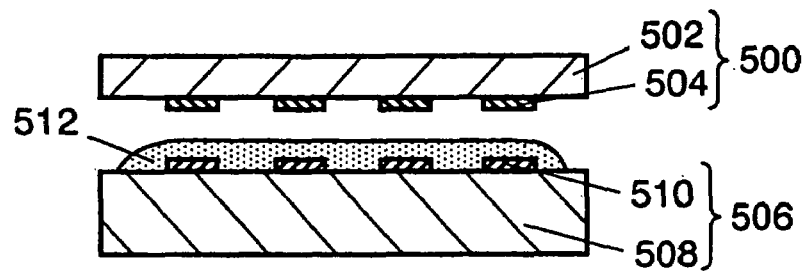
FIGS. 8A to 8C are sectional views showing a connection portion to illustrate main steps of a method for connecting conductor patterns to each other in a conventional circuit board.
Figure 8B:
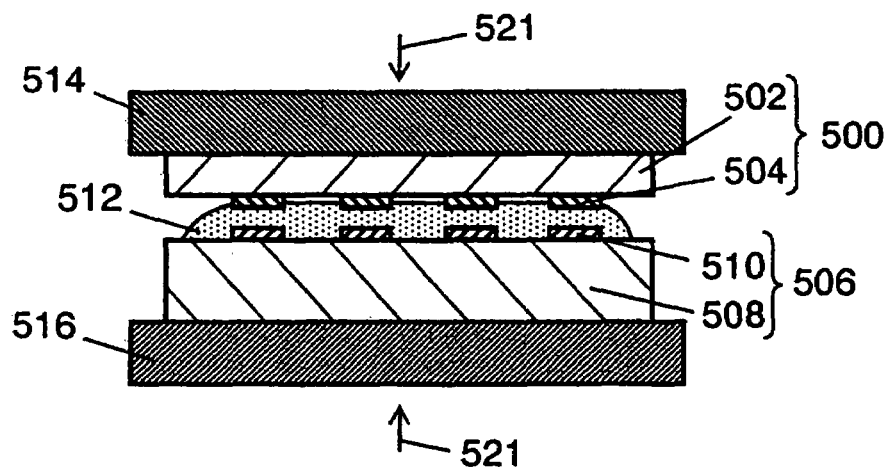
Figure 8C:
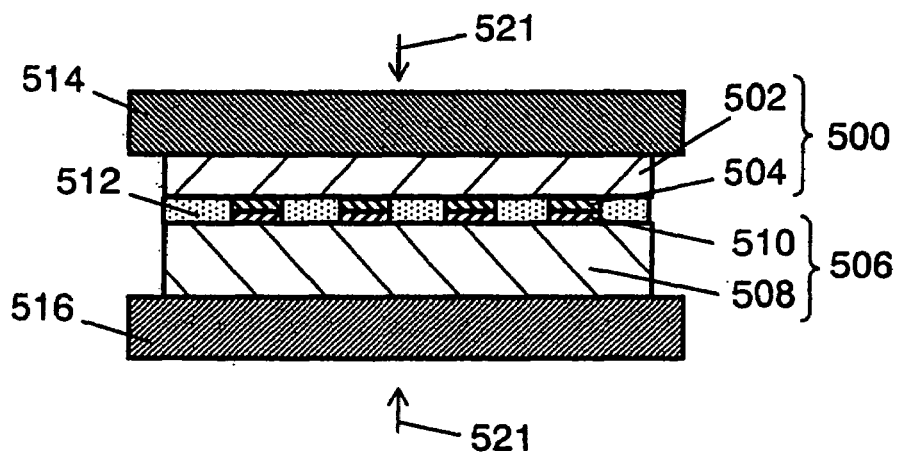

Furthermore, second circuit board 20 has the same configuration as that shown in the first embodiment. In this embodiment, it has the same shape as that of each circuit board in the conventional connecting method shown in FIG. 8, but a connecting method is different as follows. That is to say, as shown in FIG. 7B, when positions of first conductor patterns 56 of first circuit board 52 and second conductor patterns 24 of second circuit board 20 are adjusted and pressed by an upper heating pressing plate and a lower heating pressing plate (not shown), first conductor patterns 56 and second conductor patterns 24 are brought into direct contact with each other in the first place. At this time, unlike the conventional method shown in FIGS. 8A and 8C, no adhesive is applied on the surface of second conductor pattern 24. Therefore, during pressing, slipping and position displacement hardly occur.

When first conductor pattern 56 and second conductor pattern 24 are brought into direct contact with each other and electrical conduction is obtained, heating while pressing is further continued by using the upper heating pressing plate and the lower heating pressing plate. Thus, first resin base material 54 is softened so as to completely cover first conductor pattern 56 and second conductor pattern 24 and to be bonded to second resin base material 24, which is then cooled. Thereafter, when the upper heating pressing plate and the lower heating pressing plate are removed, a connecting structure of a circuit board of this embodiment, which has the same structure shown in FIG. 1, can be obtained.

In a connecting structure of a circuit board of this embodiment, since first conductor patterns 56 of first circuit board 52 may be formed on the surface of first resin base material 54, steps can be simplified. Furthermore, at the time of pressing, the first conductor patterns and the second conductor patterns are brought into direct contact with each other in the first place. Therefore, the electric connection resistance of the contact portion can be significantly reduced as compared with a conventional method. In addition, since the pressure power may be small, a pressing mechanism of the upper heating pressing plate and the lower heating pressing plate can be simplified.

As mentioned above, in the connecting structure of the circuit board of the present invention and the method for manufacturing the same, first conductor patterns of a first circuit board and a second conductor patterns of a second circuit board are brought into mechanical contact with each other to provide electrical conduction, and the first resin base material of the first circuit board covers the first conductor patterns and second conductor patterns and is bonded to the second resin base material of the second circuit board, thereby connecting the first circuit board and second circuit board to each other. Thus, a connecting structure having small electrical connection resistance can be obtained even when the first conductor patterns and second conductor patterns are arranged with fine pitch. As a result, such connecting structures are useful in the field of connection between circuit boards used for various electronic equipment such as portable electronic equipment.

The invention claimed is:

1. A connecting structure of a circuit board, comprising:
    a first circuit board including a first resin base material which is softenable by heating and which has a fusing property, and a plurality of first conductor patterns formed at a surface of said first resin base material;
    a second circuit board including a second resin base material, and a plurality of second conductor patterns formed on said second resin base material with a same pitch as that of said first conductor patterns;
    wherein said first conductor patterns and said second conductor patterns are respectively mechanically contacted with each other to provide electrical conduction;
    wherein said second conductor patterns that are respectively mechanically contacted with said first conductor patterns have widths that are respectively narrower than widths of said first conductor patterns;
    wherein said first conductor patterns and said second conductor patterns are buried in said first resin base material of said first circuit board; and
    wherein said first resin base material of said first circuit board is bonded to said second resin base material of said second circuit board, thereby connecting said first circuit board and said second circuit board to each other.

2. The connecting structure according to claim 1, wherein said first resin base material is made of a thermoplastic resin material or a thermosetting resin material.

3. The connecting structure according to claim 1, wherein said first conductor patterns do not themselves extend through an entire thickness of said first resin base material; and said second conductor patterns do not themselves extend through an entire thickness of said second resin base material.

4. A method for manufacturing a connecting structure of a circuit board, the method comprising:
    forming a first circuit board by forming a plurality of first conductor patterns at a surface of a first resin base material which is softenable by heating and has a fusing property;
    forming a second circuit board by forming a plurality of second conductor patterns on a second resin base material with a same pitch as that of said plurality of first conductor patterns;
    arranging the first conductor patterns of the first circuit board to face the second conductor patterns of the second circuit board and adjusting positions of the first conductor patterns and the second conductor patterns;
    pressing the first circuit board and the second circuit board, so that the first conductor patterns and the second conductor patterns are respectively mechanically contacted with each other so as to provide electrical conduction;
    pressing and heating the first circuit board and the second circuit board, so that the first resin base material is softened to bury the first conductor patterns and the second conductor patterns in the first resin base material, and so that the first resin base material of the first circuit board flows to the second resin base material of the second circuit board and is bonded to the second resin base material; and
    cooling the first circuit board and second circuit board;
    wherein, in said forming of the first and second circuit boards, said forming of the first conductor patterns and said forming of the second conductor patterns are carried out such that the second conductor patterns that are respectively mechanically contacted with the first conductor patterns have widths that are respectively narrower than widths of the first conductor patterns.

5. The method according to claim 4, wherein a thermoplastic resin material is used as the first resin base material.

6. The method for according to claim 4, wherein a semi-hardened thermosetting resin material is used as the first resin base material; and the step in which the first resin base material is bonded to the second resin base material comprises:

pressing while heating the thermosetting resin material to a softening temperature of the thermosetting resin material, so that the thermosetting resin material buries the first conductor patterns and the second conductor patterns and is bonded to the second resin base material of the second circuit board; and subsequently heating the thermosetting resin material to a higher temperature so as to harden the thermosetting resin material.

7. The method according to claim 4, wherein the step of forming the first circuit board comprises:

after forming the first conductor patterns at the surface of the first resin base material, further heating the first resin base material and pressing the first conductor patterns, thereby embedding the first conductor patterns in the first resin base material, so that a surface of the first conductor patterns and a surface layer of the first resin base material are made to be on the same plane.

8. The method according to claim 4, wherein the step of forming the first circuit board comprises:

after forming the first conductor patterns at the surface of the first resin base material, further heating the first resin base material and pressing the first conductor patterns, thereby embedding the first conductor patterns into the first resin base material and providing space portions having thicknesses that are smaller than thicknesses of the second conductor patterns on surfaces of the first conductor patterns.

9. The method according to claim 4, wherein the step of forming the first circuit board comprises forming recess portions having widths that are at least larger than those of the second conductor patterns of the second circuit board, having thicknesses that are larger than those of the first conductor patterns, and having thicknesses that are smaller than the total thicknesses of the first conductor patterns plus the second conductor patterns respectively mechanically contacted therewith; and forming the first conductor patterns in the recess portions, and providing space portions having thicknesses that are smaller than thicknesses of the second conductor patterns on the surfaces of the first conductor patterns.

10. The method according to claim 4, wherein in said forming of the first circuit board, the first circuit patterns are formed so as to not themselves extend through an entire thickness of the first resin base material; and, in said forming of the second circuit board, the second circuit patterns are formed so as to not themselves extend through an entire thickness of the second resin base material.

* * * * *